United States Patent
Calegari et al.

[11] Patent Number: 6,057,591
[45] Date of Patent: May 2, 2000

[54] PROCESS FOR FORMING AN EDGE STRUCTURE TO SEAL INTEGRATED ELECTRONIC DEVICES, AND CORRESPONDING DEVICE

[75] Inventors: Camilla Calegari, Bergamo; Anna Carrara, Sesto San Giovanni; Lorenzo Fratin, Buccinasco; Carlo Riva, Renate, all of Italy

[73] Assignee: SGS-Thomson Microelectronics S.r.l., Agrate Brianza, Italy

[21] Appl. No.: 09/014,437

[22] Filed: Jan. 27, 1998

[30] Foreign Application Priority Data

Jan. 31, 1997 [EP] European Pat. Off. .............. 97830029

[51] Int. Cl.[7] .............................. H01L 23/29; H01L 23/31
[52] U.S. Cl. .......................... 257/647; 257/644; 257/759; 257/760
[58] Field of Search .................................... 257/635, 637, 257/644, 647, 759, 760

[56] References Cited

U.S. PATENT DOCUMENTS

| | | |
|---|---|---|
| 4,044,454 | 8/1977 | Magdo . |
| 4,396,934 | 8/1983 | Nishida et al. . |
| 4,982,269 | 1/1991 | Calligaro . |
| 5,306,936 | 4/1994 | Goto . |
| 5,593,925 | 1/1997 | Yamaha . |
| 5,763,936 | 6/1998 | Yamaha et al. . |

FOREIGN PATENT DOCUMENTS 0 453 787 A2  10/1991  European Pat. Off. .

OTHER PUBLICATIONS

Patent Abstracts of Japan, vol. 12, No. 24 (E–576), Jan. 23, 1988, JP 62181436 (Matsushita Electronics Corp.).
Patent Abstracts of Japan, vol. 8, No. 131 (E–251), Jun. 19, 1984, JP 59043557 (Hitachi Seisakusho KK).
Patent Abstracts of Japan, vol., 14, No. 455 (E–985), Sep. 28, 1990, JP 02181925 (Mitsubishi Electric Corp.).
Patent Abstracts of Japan, vol. 96, No. 5, May 31, 1996, JP 08022983, (Citizen Watch Co. Ltd.).

*Primary Examiner*—George Fourson
*Assistant Examiner*—Joannie A. Garcia
*Attorney, Agent, or Firm*—Theodore E. Galanthay; Allen, Dyer, Doppelt, Milbrath & Gilchrist, P.A.

[57] ABSTRACT

A process for the formation of a device edge morphological structure for protecting and sealing peripherally an electronic circuit integrated in a major surface of a substrate of semiconductor material. The electronic circuit is of the type that calls for formation above the major surface of at least one dielectric multilayer. The dielectric multilayer includes a layer of amorphous planarizing material having a continuous portion extending between two contiguous areas with a more internal first area and a more external second area in the morphological structure. The device edge morphological structure includes in the substrate an excavation on the side of the major surface at the more internal first area of the morphological structure in a zone in which is present the continuous portion of the dielectric multilayer.

17 Claims, 6 Drawing Sheets

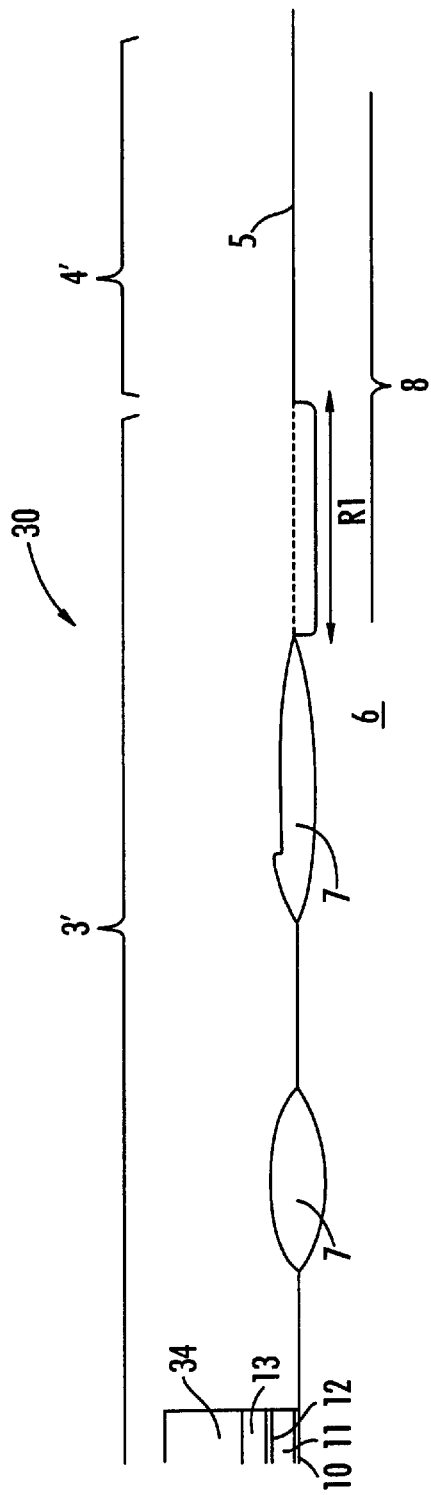
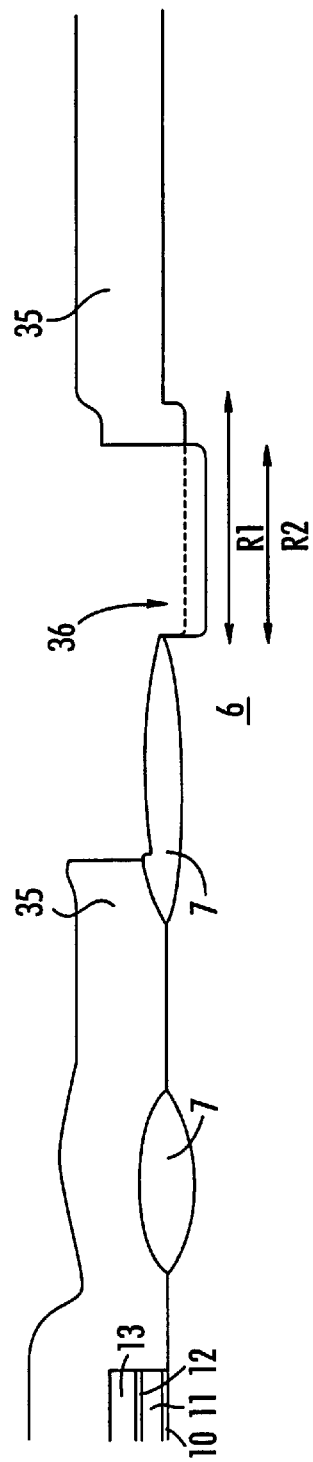

PROCESS FOR FORMING AN EDGE STRUCTURE TO SEAL INTEGRATED ELECTRONIC DEVICES, AND CORRESPONDING DEVICE

FIELD OF THE INVENTION

The present invention relates to integrated circuit manufacturing, and, more particularly, to a process for the formation of a peripheral morphological structure designed to seal integrated electronic devices and the associated devices.

Specifically reference is made to a process for the formation of a device edge morphological structure for protecting and sealing peripherally an electronic circuit integrated in a major surface of a substrate of semiconductor material of the type calling for formation over the major surface of at least one dielectric multilayer. The dielectric multilayer comprises a layer of amorphous planarizing material having a continuous portion extending between two contiguous areas with a first area more internal and a second area more external in the morphological structure.

BACKGROUND OF THE INVENTION

As is well known, electronic devices, in particular those integrated monolithically, if not carefully protected and sealed can be affected critically by the environmental conditions in which they are placed during assembly and/or during their lifetimes. In particular, the presence of humidity and other contaminating agents can result in the entry of undesired materials into the electrically active part of the device. This generally reduces the reliability of the device and can even irreversibly compromise its operation.

It is therefore crucial, especially for certain applications, to make the best possible provision for protection and sealing of the electrical circuit which is part of the device. For this purpose it is necessary to ensure perfect sealing also at the edge of the device.

For the meaning of edge of a device it should be remembered that a plurality of identical monolithically integrated circuits are formed simultaneously on a single wafer of semiconductor material, commonly monocrystalline silicon, in adjacent prepared areas. The individual devices are spaced and separated by unoccupied cross strips in which the surface of the silicon is left exposed. These strips are typically mutually orthogonal and are known as "scribe lines" and the wafer will be cut through them mechanically to separate the individual devices (the so-called "dicing" process). The edge of a device is thus the peripheral region thereof bordering on the associated scribe line.

After formation of the circuit electrical structures, i.e., of the electrical components, such as, for example, transistors or memory cells and their interconnections, the device is insulated and sealed. Layers of dielectric materials act as electrical and thermal insulators of the conducting interconnection layers and protect the underlying structures of the integrated circuit from mechanical stress, such as impacts or from contaminants (impurities, moisture), thereby creating a barrier against those harmful substances coming from the external environment.

The so-called final passivation typically includes a relatively thick layer completely covering the device to protect it. However, at the edge of the device the presence of the final passivation alone is not sufficient to ensure its sealing. Other measures are necessary. Primarily for this purpose, the most peripheral structures of the device are typically left inactive, i.e. disconnected electrically from the device terminals.

More specifically, for protection of the device at the edges there is formed a structure arranged peripherally which also permits sealing of the device. This is a device edge morphological structure and reference will be made thereto in the following description. It includes a closed ring completely surrounding the device along its entire periphery. This structure is known to those skilled in the art as Chip Outline Band (COB), i.e., a band surrounding the device.

The device edge morphological structure is formed simultaneously with the electrical structures of the integrated circuit. The more internal part of the COB, i.e. the part nearest the device, does indeed normally include structures which appear morphologically identical to the electrically active ones of the device. Moreover they do not have any electrical function since they are electrically insulated, but only act as termination for the device. The COB structure is consequently different in different devices depending on the process used and the device design.

In any case the most external part of the COB, which terminates in the scribe line adjacent to and is contiguous with the preceding part, is designed so as to completely seal the device from the external environment. For this purpose there is applied the simple principle in accordance with which to permit better sealing each overlying layer must be terminated further externally than the one immediately below. The layers are disposed to virtually cover back each other. This way the edge descends gradually downward while going near the associated scribe line, such as to enclose the integrated circuit several times in subsequent shells.

An example of a device edge structure of the known type is shown in FIG. 1. Specifically, there is represented in cross-section, not to scale, a peripheral portion of a single device. By way of example the device is of the type formed by a CMOS process with two polysilicon levels. In particular, reference is made by way of example to a device, such as a non-volatile memory typically of the EEPROM or FLASH type.

In addition, the device comprises specifically two interconnection levels. Indeed it should be remembered that two or more interconnection levels are typically provided in the more complex integrated circuits to limit the area occupied by reducing the size of the components, and, thus, of the device to thereby increase the total number of devices which can be integrated on a single wafer.

The device has been sectioned from the interior to the exterior along a line parallel to an edge. In particular, the section line passes along a source-drain line of memory cells. In FIG. 1 the visible portion of the device edge morphological structure is indicated as a whole by reference number 1. Further to the right of the figure is seen a scribe line of which the visible part is indicated by reference number 2. On the left the device edge morphological structure joins the active part of the device i.e. the actual electronic circuit (not shown in FIG. 1) of which it defines an extension with continuity. It should be remembered that the device edge morphological structure is shown in its most peripheral region, while in some cases another portion thereof comprising other electrically inactive structures could be present at the device periphery.

In FIG. 1 for greater clarity the COB is divided approximately and ideally into two regions as set forth above. A region indicated by reference number 3 is placed more internally with respect to the circuit and comprises structures morphologically identical to those of the circuit, but not electrically active and providing a sort of extension with continuity of the device circuit structures, and a region 4 which is more external or peripheral having a structure which more correctly has a device sealing function.

The device is formed in a major surface 5 of a substrate 6 of monocrystalline silicon. The process calls for simultaneous formation of the actual circuit and its edge morphological structure. Primarily on the major surface 5 are formed so-called field oxide insulation regions which are indicated by reference number 7 and define active area regions 8.

Internally to the active area are then formed the circuit structures, such as transistors and memory cells, i.e., floating gate transistors. In region 3 and in particular at the left termination of FIG. 1 is visible a structure similar to that of a memory cell along the source-drain direction and indicated as a whole by reference number 9.

The process for forming the circuit components comprises schematically the following steps:

growing in the active area regions a thin tunnel oxide, indicated by reference number 10, for the memory cells and which at the end of the process will remain in the structure of the floating gate transistors;

forming a first polysilicon layer 11, briefly Poly1, over the entire structure;

defining this first layer in a direction parallel to the source-drain lines in the memory cells to delimit the floating gate in that direction;

growing or depositing an interpoly dielectric layer 12;

removing by masking with a mask known as a "matrix" and etching the interpoly dielectric, the Poly1 and the tunnel oxide in the regions outside the memory cells matrix;

growing a thin gate oxide layer in the active area regions where there will be formed the transistors possibly, inside the matrix or in the external circuitry part;

forming a second polysilicon layer or Poly2 and typically also a silicide layer over the entire structure. The layer indicated by reference number 13 represents alternatively a single layer of Poly2 or a polycide layer formed by superimposing polysilicon and silicide;

defining a mask typically known as a matrix definition mask and following etching Poly2/interpoly/Poly1 in the matrix in a direction perpendicular to the source-drain direction for definition of the memory cell structures only in the matrix region; and defining the Poly2 layer only in the circuitry regions outside the matrix to define the structures, i.e., the transistors of the circuitry.

In the structure 9 is visible the floating gate formed by Poly1 and the control gate provided by Poly2. Beside the transistor gates are then formed oxide layers known as "spacers" 14 to insulate them. Once the structures of the electric circuit components have been completed, a so-called "intermediate" dielectric layer acting as their insulation is formed above. In the figure can be seen the portions, indicated by reference number 15, of this layer which are included in the device edge morphological structure 1. Conventionally the intermediate dielectric comprises a layer of Boron Phosphorus Silicon Glass (BPSG), i.e., of silicon oxide doped with boron and phosphorous.

Then one proceeds to formation of the electrical connections. But the transistor 9 being within the device edge morphological structure 1 will not be connected electrically to the device terminals. For formation of the connections, in the intermediate dielectric there are opened appropriate holes to the surface 5 of the substrate to allow contact therewith by overlying conducting levels. A first interconnection level, i.e. a metallization layer, typically aluminum, more briefly known as "METAL 1", is overlaid on the intermediate dielectric 15. The first metallization layer is indicated by reference number 16 and has portions in direct contact with the surface 5 through the above mentioned holes, denominated contacts. More correctly the term contacts will be used to designate those regions at openings in an interposed dielectric layer through which is provided electrical contact between METAL 1 and the substrate or METAL 1 and the circuit elements. In FIG. 1 the contacts between METAL 1 and the substrate are indicated by reference number 17.

The metallization layer 16 is then patterned so as to have the appearance of metallic strips. As shown in FIG. 1, in this embodiment the most external termination or peripheral termination 18 of the METAL 1, which is located in region 3, is placed above the intermediate dielectric 15.

Over the first interconnection level 16 is formed a multilayer of dielectric material to insulate it from a subsequent second overlying metallization layer or briefly "METAL 2" indicated by reference number 19. In the description given below reference is made to this multilayer as to an intermetallization dielectric multilayer or intermetallization dielectric because it is placed between two metallization layers.

The intermetallization dielectric is indicated as a whole by reference number 20 and also acts as a planarizer of the surface before formation of the second metallization layer 19 to ensure a deposition and a definition thereof without drawbacks. Indeed, after formation of the METAL 1 layer the surface of the resulting process structure displays a sort of stepped profile due to the presence of the structures of the electrical component and of the first metallization level.

As shown in FIG. 1, to planarize the surface of the underlying structure, the intermetallization dielectric 20 includes a layer of Spin-on Glass (SOG) which as known is commonly used for planarizing in various steps of the formation of the integrated circuits. This is an amorphous material which is deposited in the fluid state, as a solution, by means of a "spinning" process, i.e., being sprayed over the entire surface of the wafer where it is deposited in such a manner as to flow towards the deeper zones. The latter are accordingly filled and the irregularities of the underlying structure smoothed. After hardening by evaporation of the solvent, a following anisotropic etching of the SOG leaves its top surface virtually flat. The etching is stopped when the relatively higher zones of the underlying structure are completely exposed.

It should be remembered however that the SOG, since it is a highly contaminating material because of its origin, must be enclosed between insulating layers so as not to come into contact with the active structures of the circuit. Specifically, as shown in FIG. 1, the intermetallization dielectric 20 then includes a first layer consisting of a silicon oxide, typically TEOS (tetraethylorthosilicate) indicated by reference number 21, a layer of SOG 22 and a second layer of TEOS 23. The TEOS is chosen preferably because it has good chemical and physical characteristics and is a material which does not introduce contamination.

In accordance with the prior art process the first TEOS layer 21 is arranged conformal to the underlying structure and accordingly displays a profile which is still not planar. Formation of SOG in accordance with what has already been mentioned, so as to fill only the deepest portions, permits planarizing of the surface. In this manner, after the conformal deposition of the second TEOS layer 23 there is obtained a virtually planar surface for deposition of the second interconnection level 19. Following its formation, holes are opened in the intermetallization dielectric 20 by means of masking, these holes permitting formation of the so-called VIAs for contact between METAL 2 and METAL 1.

As may be seen in the figure, in region 4 of the device edge morphological structure 1 the intermetallization dielectric 20 is terminated outside the termination 18 of the first conducting layer 16, in accordance with the principle set forth above to ensure good sealing of the device. In accordance with a prior art technique, formation of the peripheral termination of the intermetallization dielectric multilayer takes place simultaneously with formation of the openings of the VIAs in the intermetallization dielectric 20, i.e. by using an opening in the same mask.

FIG. 1 shows a single VIA 24 in region 3 of the edge morphological structure 1. The intermetallization dielectric is therefore discontinuous since it is separated in two portions with one being included in region 3 and the other extending into both regions 3 and 4 of the morphological structure 1. On this subject it should be remembered that formation of the contacts, which allow connection between a metallic interconnection and the substrate or circuit components, and of the VIAs between conducting layers of different levels is very critical in very large scale integration manufacturing processes because of the extremely small cross-sectional dimensions which they must have, and of the relatively large thickness of the dielectric layer through which the holes must be made. Under these conditions, during sputter deposition of the metallization layer which will form the contact, the cover of the vertical walls of the "holes" becomes unsatisfactory and the metal deposited can display unacceptable thinning. On the other hand it is not possible to reduce the thickness of the dielectric layer, and, hence, the depth of the contact proportionately to the cross-sectional dimensions. A common attempted approach uses for the metallization portion which is to be inside the "holes", a metallic material, typically tungsten, titanium and/or titanium nitride, which can be deposited by chemical vapor phase deposition to allow easy filling of the hole.

In this direction there was developed a technique according to which the "holes" are first filled with tungsten plugs. The aluminum layer is then deposited so as to form the conducting layer. Techniques of this type are described, e.g., in the articles, "Selective CVD of tungsten and its applications to MOS VLSI" by Takahiko Moriya and Hitoshi Itoh, VLSI Research Center, Toshiba Co., presented at the Workshop 1985 of the Material Research Society; "A study of tungsten etchback for contact and VIA fill applications" by Jen-Jiang Lee and Dennis C. Hartman, presented at the IEEE VLSI Multilevel Interconnection Conference (VMIC), 1987.

More specifically in accordance with a process to which specific reference is made in the following embodiments of the present invention, for the formation of the contacts and the VIAs in the holes there is first deposited a pre-adhesion or barrier layer. Typically the barrier layer comprises a first layer of titanium (Ti) on which is deposited a second layer of titanium nitride (TiN) (together Ti/TiN) for a total thickness varying between 50 nm and 90 nm. On the barrier layer a tungsten layer is then deposited by the CVD technique. A subsequent etching leaves the tungsten only in the holes in the form of plugs. This technique is described for example in European patent application no. 0543254 to the assignee of the present invention. An improvement of this technique is described in European patent EP 0571691 also assigned to the present assignee.

In FIG. 1 the barrier layer Ti/TiN is indicated by reference number 25 and the tungsten plug by reference number 26. It is noted that, since the process calls for the peripheral termination of the intermetallization dielectric 20 to be created by means of a mask for formation of the VIAs, a tungsten residue is also present in the zone of the above mentioned termination. As may be seen in the figure, since an anisotropic etching is used, after partial removal of the tungsten for formation of the plugs a so-called tungsten bead, indicated by reference number 27, and an underlying very thin barrier layer 25, accordingly remain beside the above mentioned termination.

The second interconnection level 19 terminates towards the surface 5 of the substrate further out than the termination of the intermetallization dielectric multilayer. In particular, as discussed below, it is in contact with the intermediate dielectric layer 15. A relatively thick final passivation layer, indicated by reference number 28, completes formation of the device by providing protection of the circuit elements and the interconnection levels.

To allow separation of the devices provided on the same wafer, the final passivation layer is then etched in the scribe line region, i.e., in region 2, until reaching the substrate surface 5. The scribe line has been formed at this step. FIG. 1 shows the device as it appears at the end of this step.

The process for formation of the device edge morphological structure 1 just described concomitantly with the electrical circuit formation process and illustrated in FIG. 1 displays, however, some drawbacks which appear evident from an analysis of the structure 1 obtained. It should be is noted that normally the SOG, in accordance with the conventional planarizing process with three layers diagrammed above, is completely enclosed between dielectric material layers. This is visible even in FIG. 1 in region 3 of the device edge morphological structure, i.e., as concerns the intermetallization dielectric portion 20 placed more internally, to the left of the VIA 24.

However, as shown in FIG. 1, in accordance with the process for the formation of the device edge morphological structure in accordance with the prior art in the more external portion of the intermetallization dielectric multilayer 20, placed to the right of the VIA 24 and extending with continuity between the two contiguous regions 3 and 4, the SOG is not completely incorporated. Indeed, the intermetallization dielectric 20 in region 4 of the morphological structure 1 is in a zone placed with respect to the surface 5 at a level relatively low in the structure as obtained in the process step preceding formation of the intermetallization dielectric 20. In particular, indeed this zone is lower than the first metallization layer 16. In this zone the SOG is accordingly present. The terminal etching of the intermetallization dielectric multilayer 20 immediately outside the end of the first interconnection level 16 is formed by etching the SOG layer 22.

Accordingly, the SOG terminal portion is not insulated from the second metallization layer 19 which ends more peripherally to cover the intermetallization dielectric, but instead is in contact with the tungsten bead 27. The presence of SOG exposed to the next metallization layer 19 can give rise to defects. In a certain percentage of devices there may occur delayering of the overlying metallization level.

As known to those skilled in the art, each SOG layer, if it has not been perfectly cured, may shrink before formation of the next metallization layer. The behavior of this material is due to a natural phenomenon known as outgassing. The problems of defects connected therewith when the outgassing occurs at the interface with a metallization layer, as in our case, are illustrated for example in the article of C. Chiang, N. V. Lam, J. K. Chu, N. Cox, D. Fraser, J. Bozarth, B. Mumford, entitled "Defects study on spin on glass planarizing technology", Proceedings Conference VMIC, 1987; and in the article of M. Kobayakawa, A. Arimatsu, F. Yokoyama, N. Hirashita, T. Ajioka, entitled "A study of outgassing from spin-on-glass films used for planarizing", Proceedings Conference VMIC, 1991. As analyzed in these articles, the outgassing also leads to formation of structural defects in the metallic layers in contact with the SOG.

In addition, in the process just described and illustrated, the presence of the tungsten bead in contact with the SOG enormously worsens the problem. As shown in FIG. 1 the SOG layer 22 when shrinking inwardly, before formation of the barrier layer Ti/TiN 25, leaves an empty space indicated by reference number 29 between the outermost edges of the two dielectric layers 21 and 23. The side surface of the termination of the intermetallization dielectric 20, obtained after cutting of the dielectric and which must be covered by the second interconnection level, because of the SOG shrinkage is accordingly irregular and has a negative slope.

This induces a stress in the barrier layer 25. To this is added the fact that the thickness of the barrier layer 25 is much reduced as described above and is deposited by an anisotropic technique and therefore on such a negative step it is thinned, i.e., it does not have uniform thickness, and can even be missing at some points. For these reasons delayering of the barrier may occur, i.e., partial lifting thereof along the contact with the termination of the intermetallization dielectric.

The tungsten layer formed at this point is deposited both outside and inside the lifted edges of the barrier layer 25. It should be remembered that tungsten has high stress, and that during a common process for forming tungsten, tungsten fluoride is typically used as a source. This highly corrosive gas is able to penetrate any holes present in the barrier layer. The tungsten etching necessary for formation of the plugs thus generates a highly defective structure. The following metallization layer 19 can accordingly be delayered, differently from how it appears in the ideal case shown in FIG. 1.

The device can be damaged in case of marked delayering in which there can be generated on the surface of the wafer residues of delaminated layers which cause short circuiting of active metallizations. Alternatively such a defective structure, which since it is a device edge morphological structure is not electrically active, may not immediately damage the functionality of the device, but which once operating would become clearly unreliable in a more or less short time because it is not correctly sealed. The problem described is accentuated in the devices located near the wafer edge, in which the barrier layer is thinned because it forms a meniscus upon deposition.

Another drawback can occur in the known device edge structure shown in FIG. 1. It can be observed that the intermediate dielectric layer 15 of BPSG located to the right of the most external contact 17 does not display discontinuities, extending from the contact 17 to the scribe line 2. During opening of the VIAs for formation of the contacts between the two metallization layers 16 and 19 the peripheral multi-etching of the intermetallization dielectric 20 forming the termination of the multilayer 20 in fact continues in part towards the underlying intermediate dielectric 15. The intermediate dielectric 15 should be entirely removed, but as shown in the figure it can be etched only partially due to process marginality. At the end of the etching accordingly a layer of BPSG of reduced thickness remains underneath the bead 27. Thus a continuous layer of BPSG is left between the contact 17, i.e. between the METAL 1 and the outside with resulting reliability problems. The BPSG represents in the known structure a continuous path for entry of moisture toward the first interconnection level. As known indeed the chemical reaction between BPSG and moisture produces phosphoric acid which can corrode the metallization layers.

On the other hand, totally avoiding etching the intermetallization dielectric inside the device so that it may extend to the scribe line is not a possible solution to the problems discussed, because there would remain a SOG part exposed to the scribe line, and hence, to the external environment with a resulting lack of insulation of the device because of the high hygroscopicity of the SOG.

The problem illustrated accordingly seems insoluble. Indeed, good sealing is prevented for any device in which SOG is to be used as the planarization layer because of the presence of at least one subsequent metallization level. The same problem arises both in the framework of a intermetallization dielectric for a device having at least two interconnection levels, and in a case not specifically described in which the SOG is already used in the intermediate dielectric for devices having a single metallization level and in which inside the intermediate dielectric there are to be formed contacts for the first metallization level.

It should be noted that although the drawbacks described are discussed for the case exemplified in FIG. 1 they can appear every time a dielectric having similar characteristics, such as an amorphous planarizing material highly contaminating especially for the metallization layers and capable of generating defects, is used for the planarizing instead of SOG. In addition these shortcomings are very devastating when the contacts and the VIAs are created by means of the described plug technique.

There thus exists a need to conceive a process for formation of a device edge morphological structure allowing perfect sealing of the device even when planarizing materials such as SOG are present. On the other hand the process must not entail an increase in complexity with respect to a conventional process with the addition of dedicated process steps.

SUMMARY OF THE PRESENT INVENTION

In view of the foregoing background, it is therefor an object of the invention to provide a method and device including a device edge morphological structure allowing perfect sealing without increased complexity.

Within the present invention a process for the formation of a device edge morphological structure to protect and seal peripherally a circuit integrated in a major surface of a substrate of semiconductor material calls for formation above the major surface of at least one dielectric multilayer. The latter includes a layer of amorphous planarizing material. At least one continuous portion of this planarizing material extends between two contiguous areas, a more internal area and a more external area, with respect to the device, in the morphological structure.

In accordance with the present invention, inside the device edge morphological structure, in the substrate is formed an excavation on the side of the major surface at the more internal first area of the morphological structure in a zone in which is present the continuous portion of the layer of amorphous planarizing material.

In this manner, a difference in height is artificially generated in the device edge morphological structure between the innermost area and the outermost area in which the excavation has not been performed. The layers formed above the substrate are accordingly lowered in the first area in a depression with respect to the substrate surface. Even the continuous portion of the dielectric multilayer, formed with continuity between the two areas of the device edge morphological structure, is accordingly lowered in the innermost area. In other words, the dielectric multilayer at the moment of its formation is located on a structure which displays a peripheral higher zone.

The peripheral termination of the amorphous planarizing material, such as SOG, is placed in a relatively higher position than the rest of the layer. Accordingly the SOG layer contained in the continuous portion of the dielectric multilayer with respect to the conventional circuits flows so to speak towards the more internal region of the device edge morphological structure. In the most peripheral region, the SOG layer is thinned. In this manner in the zone where the peripheral termination of the dielectric multilayer is to be formed, the SOG is completely lacking or at least reduced very much.

In the typical case in which the dielectric multilayer comprises two dielectric layers, for example TEOS, enclosing the amorphous planarizing material, the latter is thus completely enclosed by two dielectric layers even inside the device edge morphological structure. In other words, the end part of the amorphous planarizing material is delimited by layers of non-contaminating dielectric material. In accordance with the present invention, SOG exposed to the environment during the process or in contact with a subsequent metallization is avoided.

Advantageously therefore practically perfect sealing of the device is ensured since on the one hand passage of moisture through the material, such as SOG, is prevented because it is not in contact with the exterior. On the other hand the fact that the contaminating material, and with critical behavior, is insulated from the following metallization layer prevents formation of defects with possible delayering of the metallization layer, especially where the contacts are formed by the tungsten plug technique. The prior art problems are thus solved.

The excavation for this purpose completely surrounds the device having virtually a closed ring form. Preferably it displays two different parts at different depths with one part at a greater depth contained in a part at a lesser depth which surrounds it. In this manner the excavation seen altogether has descending walls, allowing the structure which is formed above to be lowered in the excavation without breakage or other shortcomings.

In accordance with a preferred embodiment of the present invention as applied to an intermetallization dielectric multilayer, the excavation is formed in the substrate so as to contain every of the zone active areas in which will be formed contacts between a first metallization layer underlying the intermetallization dielectric and the substrate insofar as to the zone corresponding to the above mentioned continuous and more peripheral portion of the intermetallization dielectric multilayer. In this manner the level of the above mentioned contact, defining the higher zone on which is formed the SOG in the first more internal area which in accordance with the present invention must be lowered, is also lowered.

In addition, in accordance with the preferred process according to the present invention, no additional process steps are necessary with respect to those already included in a conventional process. Indeed, in the case of a CMOS process for a device such as a non-volatile memory circuit, the present invention is particularly advantageous because it is possible to use for formation of the excavation masks already used during a conventional process for formation of the device whose layout is appropriately modified in the part of the device edge morphological structure. In particular, the preferred embodiment calls for an appropriate use of the masks for definition of the polysilicon gates to create the excavation automatically.

To improve the difference in height between the two contiguous regions of the device edge morphological structure in accordance with the present invention it is furthermore possible to create an additional difference in height with the formation in the most peripheral region of the device edge morphological structure of another layer in the form of a bead having only this structural function.

BRIEF DESCRIPTION OF THE DRAWINGS

The characteristics and advantages of the process in accordance with the present invention are set forth in the description of an embodiment thereof given below by way of non-limiting example with reference to the annexed drawings. In the drawings:

FIGS. 2 to 6 show the significant steps of a preferred process for formation of a device edge morphological structure in accordance with the present invention for a device, such as a memory circuit of the type illustrated in FIG. 1.

DETAILED DESCRIPTION OF THE PREFERRED EMBODIMENTS

With reference to FIGS. 2 to 6, reference number 30 indicates schematically and as a whole a device edge morphological structure or COB provided in accordance with the present invention. The process for the formation of the device edge structure 30 in this diagram is of the type with two metallization levels. In this preferred example, the process is CMOS type with two polysilicon layers, usable typically for the formation of programmable non-volatile memory circuits of the PROM type (EPROM, EEPROM or Flash). More specifically, reference is made by way of example to a device containing a FLASH memory. By way of example there is used the same type of process, but modified in accordance with the present invention as already described with reference to the prior art.

The FIGS. 2 to 6 are vertical cross-sections, not to scale, made along a plane of section parallel to an edge of the die, in particular, passing through a source-drain line of the memory cells matrix. In these FIGS. 2 to 6, for greater clarity, a scale different from that of the above FIG. 1 was used.

Figure 1:
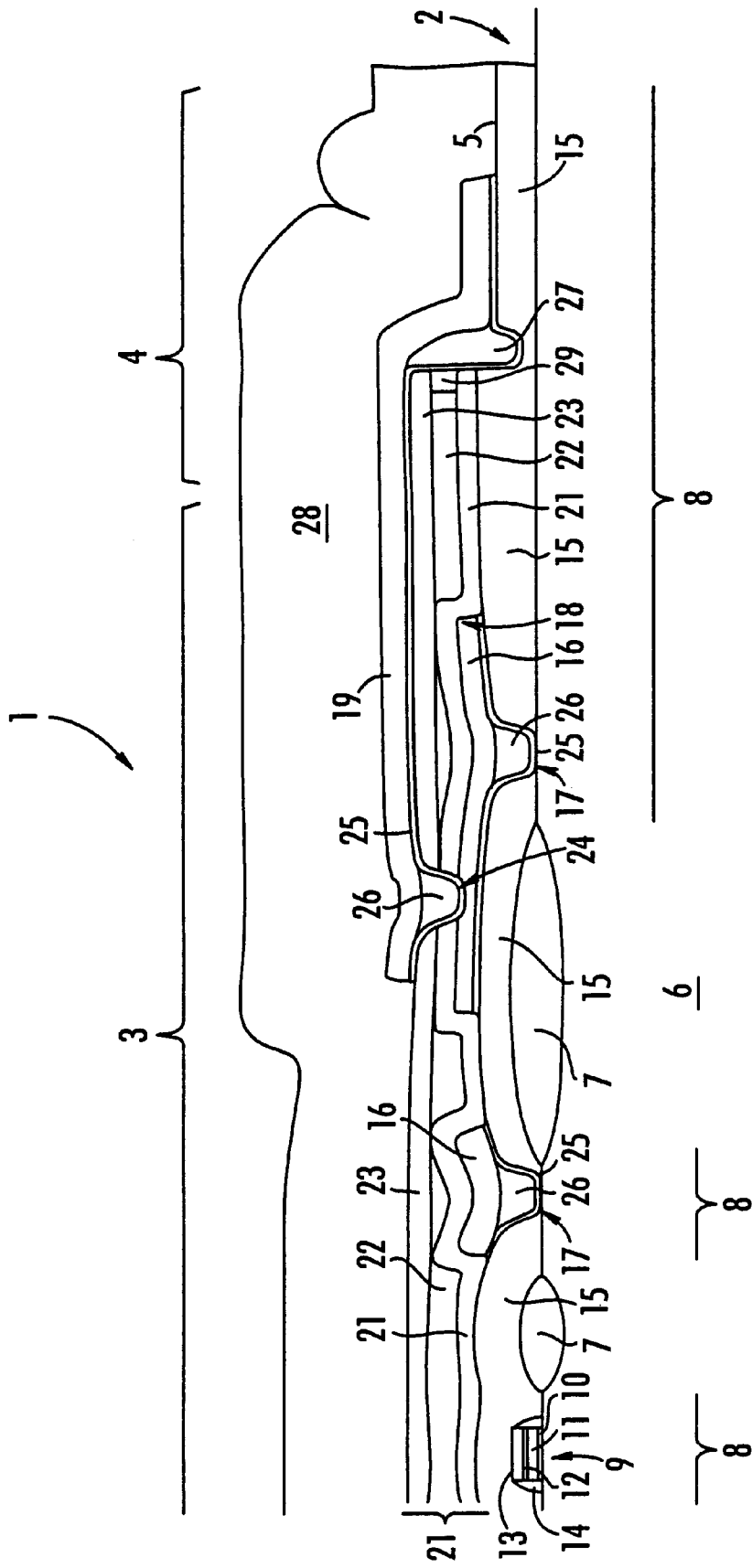
FIG. 1 shows a cross section of a portion of a device edge morphological structure provided in accordance with a conventional prior art process for example of the CMOS type, as described above.

In the FIGS. 2 to 6 the same reference numbers as used for illustration of the prior art of FIG. 1 are maintained for elements or regions which are equal or equivalent. It should be remembered that only some of the steps of the entire process, significant for the present invention, are shown in FIGS. 2 to 6.

Of the edge structure are indicated schematically separately both the more internal region indicated by reference number 3', which is an extension of the circuit structures of the device, and the more external region 4' having more properly a sealing function. With specific reference to FIG. 2 the process for sealing of the device comprises initially conventional steps for the formation of a device edge morphological structure. The latter is formed simultaneously with the electrically active structure of the device located further internally on the die, on the left of FIG. 2 and not visible.

The initial phases of a simultaneous forming process for a device and a device edge morphological structure comprise definition on the major surface 5 of the monocrystalline silicon substrate 6 of insulation regions where there is formed a thick silicon oxide layer, so-called field oxide 7, delimiting active area regions 8. Subsequently in the active area regions a silicon oxide layer 10 is grown by means of high temperature thermal oxidation. The silicon oxide layer 10 will represent the tunnel oxide of the the memory cells in the integrated circuit active structures.

Above this layer is formed, by deposition over the entire surface of the wafer, the first polysilicon layer 11 which will provide the floating gate of the memory cells. The interpoly dielectric 12 is thus formed conventionally. Although in FIG. 2 it is indicated as a single layer, in accordance with a conventional preferred process it is typically made up of a triple oxide/nitride/oxide (ONO) layer. The two oxide layers are conventionally obtained by thermal oxidation or CVD deposition and the silicon nitride layer by CVD deposition.

At this point, in accordance with a conventional process sequence, the layers just formed are removed from the regions outside the cell matrix. For this purpose one proceeds to masking of the zones not involved in the etching. In accordance with an entirely conventional process, a photosensitive material layer, such as a resin known as photoresist, is deposited on the surface of the wafer and then removed by a photolithographic technique in the zones which are to be etched. In this process step there is used specifically the so-called "matrix" mask by means of which are etched in sequence the layers of interpoly dielectric, Poly 1 and tunnel oxide.

Figure 2:
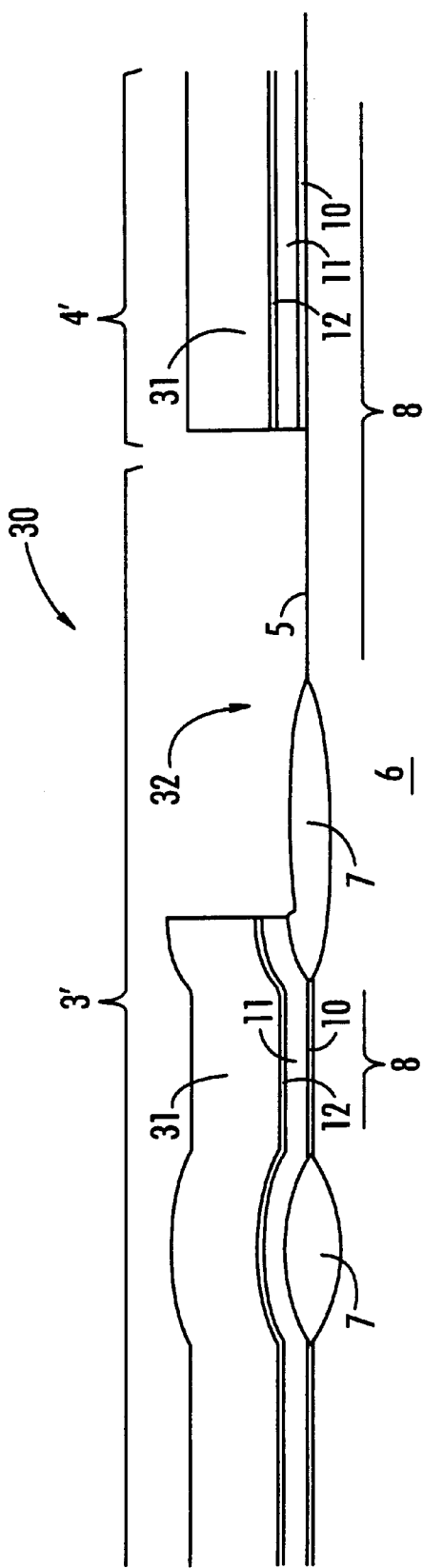

As shown in FIG. 2, in accordance with the preferred process of the present invention the matrix mask as indicated by reference number 31 is modified with respect to the conventional case in which it left the most peripheral region of the device completely uncovered. But in the zone of the device edge morphological structure, the mask 31 displays only one opening 32. The opening 32 extends partially in correspondence with the field oxide 7 and the most peripheral active area region 8. As may be seen this opening is still located within the more internal region 3' of the morphological structure 30 near the region 4'.

FIG. 2 shows the device edge morphological structure after etching of the above mentioned layers. As may be seen the uncovered zone of the field oxide 7 is partially etched away during the oxide removal step. The decrease in thickness of the field oxide is, however, comparably limited.

Figure 3:
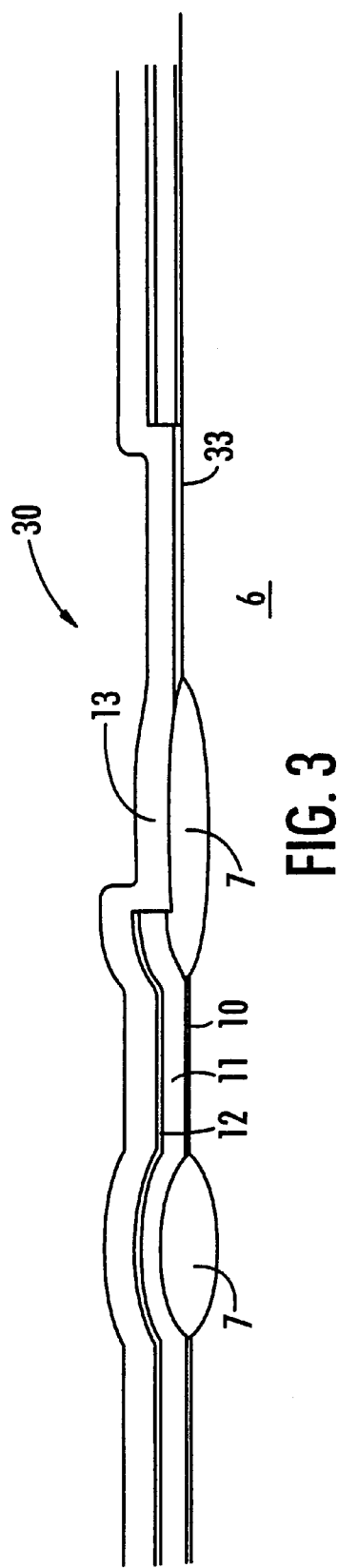

After removal of the mask 31 one proceeds to grow, by means of thermal oxidation, a silicon oxide which will serve as gate oxide for the circuit transistors. The oxidation operation as known is such that the oxide layer 33 as shown in FIG. 3 is formed on the regions of the active area 8 in which the silicon is exposed.

The second polysilicon layer, indicated by reference number 13, is then deposited over the entire obtained surface of the wafer. An additional silicide layer (not indicated) is also deposited immediately.

For definition of the memory cells structure the polysilicon layers are then partially removed in an appropriate manner after masking by means of the matrix definition mask. In accordance with the preferred process of the present invention that mask, indicated by reference number 34 in FIG. 4, in the zone of the device edge morphological structure 30 is open until the edge of the device, i.e., to the scribe line.

The etching calls for removal in successive steps of silicide, polysilicon, oxide, again polysilicon, and oxide. As may be seen in FIG. 4 the second polysilicon etching in the active area region 8 placed to the right of the field oxide region 7 forms an excavation in the substrate 6. This part is indicated by reference R1, defines the active area zone not masked by the previous mask 31. The part R1 is located within the more internal region 3' of the device edge morphological structure 30.

A subsequent mask is used for etching of the silicide and Poly2 in the area of the external circuitry for definition of the structure of the transistors in this zone. Inside the device edge morphological structure the Poly2-circuitry mask indicated by reference number 35 in FIG. 5, displays a pattern similar to that of the mask 31 of FIG. 2. But the opening, indicated by reference number 36, in accordance with the present embodiment of the invention is enclosed in the opening previously indicated by 32 of the masking layer 31.

Removal of the silicide and Poly2 causes formation in the R2 part of another excavation in the surface of the silicon which is not masked. The depth of the excavation is approximately equal to the thickness of the silicide and polysilicon layers.

In accordance with the preferred process of the present invention is accordingly formed an excavation in the region 3' of the device edge morphological structure with use of conventional process steps and standard masks modified in the zone of the device edge morphological structure. The excavation obtained permits creating a difference in height between region 3' in which it is completely contained and the more external region 4'.

In the surface 5 of the substrate 6 and inside region 3' of the device edge morphological structure in accordance with the present embodiment of the invention there is obtained an excavation having differentiated depth. Use of two masks and which in addition have partially superimposed etching windows permits on the one hand increasing the depth of the excavation, and, hence, the difference resulting in height therefrom in the surface of the silicon, and on the other hand, decreasing the slope of the step between the surface 5 of the silicon and the bottom of the excavation, at least towards the die edge. It should be observed indeed in FIG. 5 that the part R1 of the excavation exceeds the part R2 only towards the region 4' while on the other side both terminate at the field oxide. In this manner the structures which are subsequently formed in the active area region 8 placed to the right of the field oxide 7 will not undergo excessive tensile stresses.

The process continues from this moment forward in the conventional manner. In this embodiment of the present invention conventional masks can preferably be readily used in the device edge morphological structure region.

Then one proceeds to completion of the formation of the circuit structures and formation of the oxide spacers on the transistor sides. A floating gate transistor structure is visible in FIG. 6 in the part further to the left of region 3' and indicated by reference number 9. The side spacers are indicated by reference number 14.

To insulate the circuit elements the intermediate dielectric layer 15 is formed. Although it is illustrated as a single layer, the latter is normally made up of one or more silicon oxide layers, doped or not. Typically it comprises a layer of BPSG as already described with reference to the prior art.

For electrical connection between the circuit components the first interconnection level comprising a conducting layer is deposited on the intermediate dielectric 15, in which windows have been appropriately opened and here the contacts 17 formed, either with the substrate or with the components. In accordance with the preferred embodiment of the present invention one of the contacts, the more peripheral one, but in any case contained in region 3', is formed inside the part R2 of the excavation.

Figure 6:
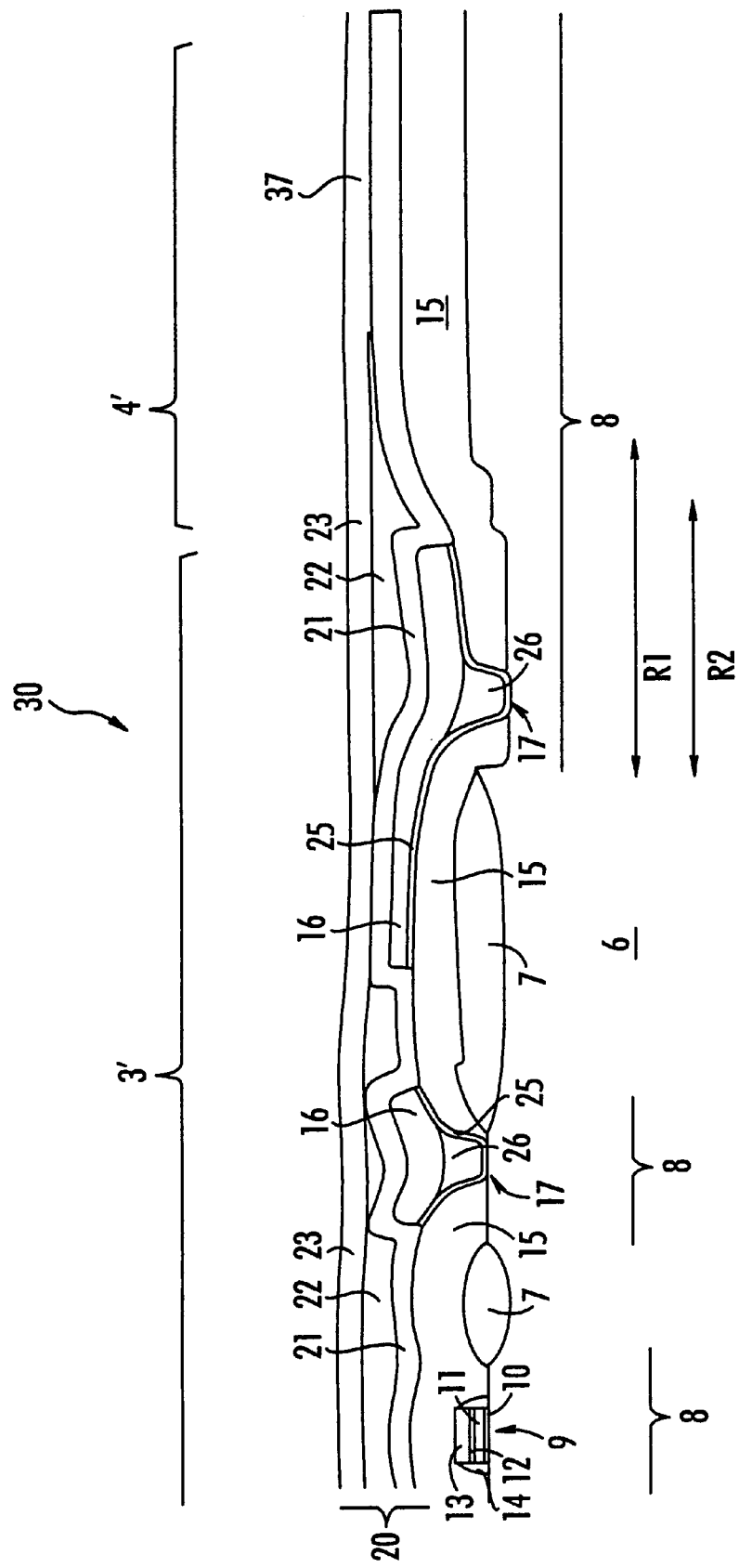

The first metallization layer, indicated by reference number 16, is typically of aluminum or an alloy thereof for example Al/Si/Cu. The layer 16 is then patterned in the form of strips by removing it elsewhere. As shown in FIG. 6, in the device edge morphological structure 30 the first metallization layer 16 has its peripheral termination over the intermediate dielectric 15 inside the part R2 of the excavation.

Over the entire surface is then formed the intermetallization multilayer of dielectric material, electrically insulating the first metallization layer 16 from the second upper interconnection level. The intermetallization dielectric, indicated as a whole by reference number 20, also acts as a planarizer of the entire surface and for this purpose comprises the layer of amorphous planarizing material, SOG in this case, indicated by reference number 22. The amorphus planarizing material is enclosed between a first and a second dielectric layer. The process for formation of the intermetallization dielectric 20 calls for conformal deposition of the first dielectric layer 21 (TEOS in the present exemplified embodiment) by one of the chemical vapor deposition techniques (CVD); then covering the entire surface by spinning with SOG; etching thereof until it is only left in the deeper portions of the resulting structure to form the layer 22; and lastly conformal CVD deposition of the following dielectric layer 23, also TEOS, such as to enclose the SOG.

It is noted that at this step of the process because of the presence of the excavation in the regions R1 and R2 the SOG is virtually absent in the peripheral region 4'. The layer of SOG indeed during its formation because of the difference in height, accentuated with respect to the prior art and created by the excavation, has filled the deeper zones in the region of the excavation and hence in region 3'. In the zone 37 of the intermetallization dielectric 20, contained in the region 4', as may be seen in FIG. 6 the two layers of TEOS 21 and 23 are in direct contact without interposed SOG. It is in this zone that the intermetallization dielectric 20 can be terminated in accordance with the present invention, as may be seen in the following FIG. 7 which represents the morphological structure 30 at the end of the process.

Figure 7:
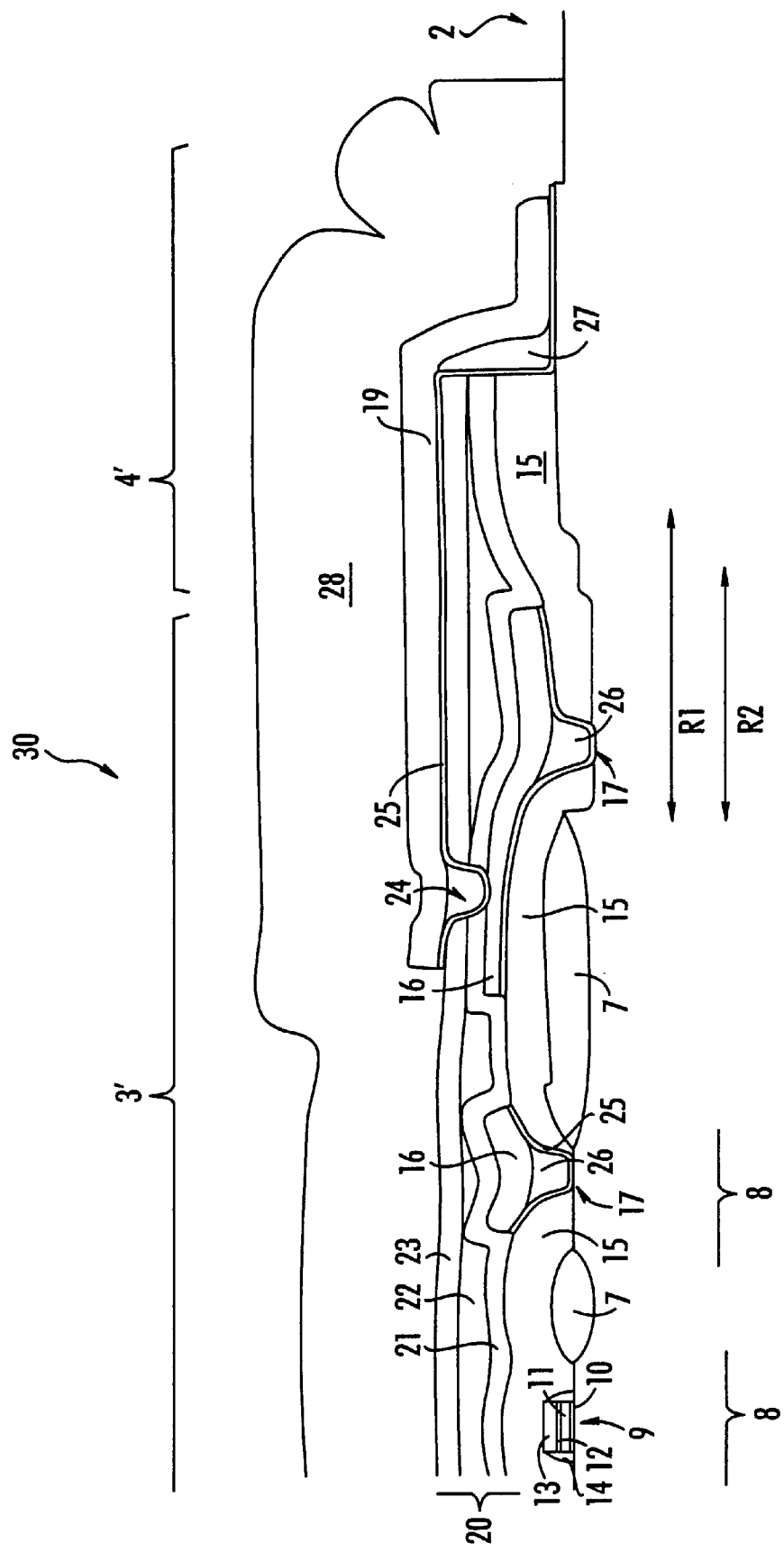
FIG. 7 is a device provided in accordance with the present invention using, for example, the process illustrated in the above FIGS. 2 to 6.

Indeed, in this process step the VIA mask is applied for opening through the intermetallization dielectric 20 of the contact paths between a following metallization level 16 which is to be formed and the first interconnection level 16. In accordance with the present invention and as shown in FIG. 7 the etching window is located in zone 37, i.e. above a part which in the step preceding formation of the intermetallization dielectric multilayer 20 is at a higher level than the rest of the device edge morphological structure in that process step. In this zone the layer of intermetallization dielectric 20 is placed above the intermediate dielectric 15.

Removal of the layer 20 of intermetallization dielectric is differentiated for the three layers 21 to 23 and is performed by means of conventional chemical and physical etching techniques. The etching is stopped in the circuit and in region 3' of the device edge morphological structure on the underlying metallization layer 16 as shown in FIG. 7. Windows are thus opened in the integrated circuit for formation of the VIAs between the two interconnection levels. In the region 4' removal of the intermetallization dielectric allows formation of its peripheral termination. Here the etching of the oxide layer 21 continues on the intermediate dielectric layer 15 until it reaches the surface 5 of the substrate 6.

In accordance with the present invention the continuous portion of intermetallization dielectric 20 arranged to the right of the VIA 24 has its peripheral terminal part, included in the region 4', which is located in turn on a relatively high zone of the underlying structure, and, hence, higher than the adjacent central part which is inside region 3'.

Along the termination of the intermetallization dielectric 20 are present in contact the two TEOS layers 21 and 23. In other words, the SOG is enclosed in its end zone. In general, the basically contaminating material is entirely delimited by an insulating and non-contaminating material like TEOS. The SOG in the device edge morphological structure 30 for sealing is accordingly fully insulated. It should be remembered that advantageously every cut made in the intermetallization dielectric 20 within the morphological structure 30 is made without etching the SOG and accordingly is not critical in accordance with the present invention.

After the etching, one proceeds to formation of the contact VIAs for the second metallization level, typically in accordance with the tungsten plug technique already described above. The bead 27 in accordance with the present invention is still present. In this case however it is insulated by the SOG as may be seen in the figures. The drawbacks of delayering of the following metallization layer, which are described in relation to the prior art and due to the presence of SOG in contact with the tungsten, are accordingly completely overcome.

The conducting layer 19 is finally deposited and then patterned in accordance with the selected configuration, for example identical to that of the prior art illustrated in FIG. 1. In region 4' virtually during this step a peripheral termination is created for this layer. The metallization layer 19 as in the conventional case illustrated in FIG. 1 terminates further externally than the underlying metallization layer 16 and the intermetallization dielectric 20. In accordance with the present invention the termination of the metallization layer 19 is in contact with the surface 5 of the substrate 6.

The process for the device forming is completed in the conventional manner by formation of the final passivation layer 28 over the entire surface of the wafer and then cleaning of the scribe lines 2. Even though the passivation layer appears in FIG. 7 as a single layer it can consist of the superimposition of several layers of lesser thickness, equal or different, depending on the process used. FIG. 7 shows the device after cleaning of the scribe lines 2.

Advantageously accordingly accordancing to the preferred process just described the external perimeter of the intermetallization dielectric 20 in the individual die displays two TEOS layers 21 and 23 in contact without SOG. The absence of exposed SOG ensures good reliability to the formed device in terms of sealing. Indeed, contact of the SOG with the second metallization level 16 is avoided so to speak by having the SOG flow towards more internal regions, i.e., towards region 3'. On the other hand, the SOG is not extended to the scribe line, and, thus, is not exposed to the environment. The problem of moisture penetrating into the device directly through this material is thus avoided.

In addition, as may be observed from the figure, the part of the intermediate dielectric layer 15 placed to the right of the most peripheral contact 17 does not reach the scribe line but is discontinuous at the bead 27. Indeed, the etching of the intermediate dielectric as mentioned above in the preferred case can continue to the surface of the substrate because the intermetallization dielectric layer 20 in the region to the right of the excavation is reduced for lack of SOG. Accordingly, in the preferred embodiment of the present invention there is no longer any risk that the BPSG will act as a vehicle for the entry of moisture towards the metallizations.

It should be remembered that if by way of example the present invention is described for a specific process, however in general the principles on which it is based are applicable to a different process for formation of a device edge morphological structure comprising a dielectric multilayer with amorphous planarizing material even different from SOG. The present invention is particularly advantageous when the tungsten plug technique is used for formation of the contact vias.

It can be observed that although the present invention is described in relation to an intermetallization dielectric multilayer, it is also applicable for a dielectric multilayer used as intermediate dielectric and comprising an SOG-type layer. It is accordingly applicable even to devices having a single interconnection level. More generally, i.e., the present invention is applicable to a dielectric multilayer on which a metallization layer is to be formed.

In addition, although a typical dielectric multilayer comprising two TEOS layers enclosing a SOG layer is described, the multilayer can have a different composition. For example, the TEOS layers could be replaced by other dielectric materials, and a different number of layers but comprising in any case an amorphous planarizing material.

It should be remembered that the two regions 3' and 4' in which the device edge morphological structure has been divided in accordance with the present invention represent only a diagrammatic and not a rigid division of the structure, useful for description purposes. Even the most peripheral and continuous portion of the dielectric multilayer extending between both of the two regions can be divided ideally in a more internal area in which is formed the excavation and a more peripheral area without excavation and in which is formed the termination of the dielectric multilayer. Although for the sake of simplicity in the description in the above example the division of the morphological structure and that of the dielectric multilayer were made to coincide, this is not an indispensable requirement for the purposes of the present invention.

It should be remembered that in relation to the present invention raising of the zone at which the dielectric multilayer is to be ended should be considered in relation to the region occupied by the device edge morphological structure. In some zones of the circuit the level can be higher because of the presence of additional structures, such as the gate structures of the transistor or memory cells which as mentioned above display superimposition, for example, of polysilicon layers.

Figure 8:
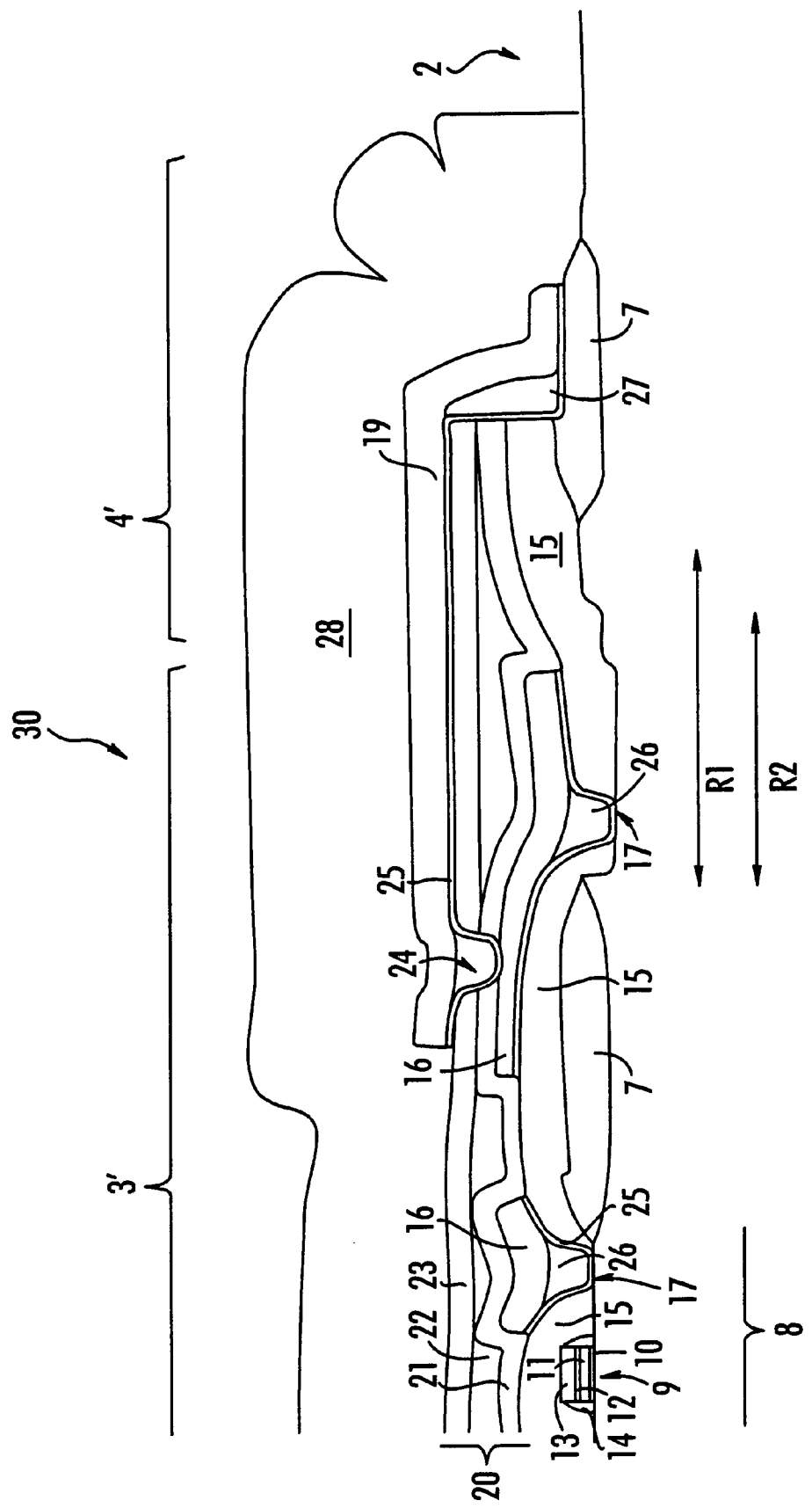
FIG. 8 is an alternate embodiment of the device in accordance with the present invention also using, for example, the process illustrated in the above FIGS. 2 to 6.

It should also be noted that within the framework of the present invention if the excavation is not sufficient to ensure an adequate difference in height between the regions 3' and 4' it is possible to increase this difference by artificially creating a zone with higher elevation in the region 4' where the dielectric multilayer is to terminate. For example, a polysilicon bead or a field oxide barrier can be formed inside the edge region as shown in the alternate embodiment of FIG. 8. Advantageously for this purpose there can be used process steps and masks already present in the formation process of the transistors and/or memory cells, for example, in the case of CMOS technology.

Although the above description is given for the case of a two-level interconnection process, the process in accordance with the present invention is of course applicable even for several metallization levels if the principles of the present invention are applied and differences in height are created artificially within the device edge morphological structure.

Obviously, modifications and changes all however falling within the scope of the present invention as defined in the following claims can be made to the process for the formation of a device edge morphological structure described and illustrated above.

That which is claimed is:

1. An electronic device comprising;

a semiconductor substrate having a major surface;

an electronic circuit integrated in the major surface of said semiconductor substrate;

a device edge morphological structure for protecting and sealing peripherally said electronic circuit, said device edge morphological structure comprising at least one dielectric multilayer including a layer of amorphous planarizing material, said at least one dielectric multilayer having a continuous portion extending between two contiguous areas with a first area being more internal and a second area being more external in the device edge morphological structure; and an excavation inside the device edge morphological structure in said substrate on a side of the major surface in correspondence with the more internal first area of said device edge morphological structure in a zone in which is present the continuous portion of the at least one dielectric multilayer.

2. An electronic device according to claim 1, wherein said excavation has virtually a ring form arranged so as to completely surround the electronic circuit.

3. An electronic device according to claim 1, wherein said excavation comprises a first part having a first depth and a second part contained in said first part and having a second depth which is greater than the first depth.

4. An electronic device according to claim 3, wherein the first part of said excavation exceeds the second part only towards the more peripheral second area.

5. An electronic device according to claim 1, wherein said excavation is formed in an active area zone.

6. An electronic device according to claim 5, further comprising at least one contact of a first metallization level underlying said at least one dielectric multilayer; and wherein the active area zone includes said at least one contact.

7. An electronic device according to claim 1, wherein said layer of amorphous planarizing material comprises SOG (Spin-on Glass).

8. An electronic device according to claim 1, further comprising means for creating a higher elevation where the dielectric multilayer terminates.

9. An electronic device according to claim 8, wherein said means for creating a higher elevation comprises a field oxide layer in the substrate external to the excavation.

10. An electronic device comprising;

a semiconductor substrate having a major surface;

an electronic circuit integrated in the major surface of said semiconductor substrate;

a device edge morphological structure for protecting and sealing peripherally said electronic circuit, said device edge morphological structure comprising at least one dielectric multilayer including a layer of amorphous planarizing material, said at least one dielectric multilayer having a continuous portion extending between two contiguous areas with a first area being more internal and a second area being more external in the device edge morphological structure; and an excavation inside the device edge morphological structure in said substrate on a side of the major surface in correspondence with the more internal first area of said device edge morphological structure in a zone in which is present the continuous portion of the at least one dielectric multilayer;

said excavation comprising a first part having a first depth and a second part contained in said first part and having a second depth which is greater than the first depth.

11. An electronic device according to claim 10, wherein said excavation has virtually a ring form arranged so as to completely surround the electronic circuit.

12. An electronic device according to claim 10, wherein the first part of said excavation exceeds the second part only towards the more peripheral second area.

13. An electronic device according to claim 10, wherein said excavation is formed in an active area zone.

14. An electronic device according to claim 13, further comprising at least one contact of a first metallization level underlying said at least one dielectric multilayer; and wherein the active area zone includes said at least one contact.

15. An electronic device according to claim 10, wherein said layer of amorphous planarizing material comprises SOG (Spin-on Glass).

16. An electronic device according to claim 10, further comprising means for creating a higher elevation where the dielectric multilayer terminates.

17. An electronic device according to claim 16, wherein said means for creating a higher elevation comprises a field oxide layer in the substrate external to the excavation.

* * * * *